(12) United States Patent
Lee

(10) Patent No.: US 6,862,238 B1
(45) Date of Patent: Mar. 1, 2005

(54) MEMORY SYSTEM WITH REDUCED REFRESH CURRENT

(75) Inventor: Joo-Sang Lee, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/672,244

(22) Filed: Sep. 25, 2003

(51) Int. Cl.$^7$ ................................................ G11C 7/00
(52) U.S. Cl. .................... 365/222; 365/227; 365/230.03
(58) Field of Search ............................ 365/222, 230.03, 365/227

(56) References Cited

U.S. PATENT DOCUMENTS

| | | | | |
|---|---|---|---|---|
| 4,914,630 A | * | 4/1990 | Fujishima et al. ...... | 365/189.04 |
| 4,933,907 A | * | 6/1990 | Kumanoya et al. .......... | 365/222 |
| 5,331,601 A | | 7/1994 | Parris ..................... | 365/230.08 |
| 5,796,669 A | * | 8/1998 | Araki et al. ................. | 365/222 |
| 5,875,143 A | | 2/1999 | Ben-Zvi ..................... | 365/222 |
| 6,079,023 A | * | 6/2000 | Yoon et al. .................. | 713/300 |
| 6,226,709 B1 | * | 5/2001 | Goodwin et al. ........... | 711/106 |
| 6,233,192 B1 | * | 5/2001 | Tanaka ........................ | 365/222 |
| 6,363,024 B1 | | 3/2002 | Fibranz ...................... | 365/222 |
| 6,373,769 B1 | | 4/2002 | Kiehl et al. ................. | 365/222 |
| 6,404,690 B2 | | 6/2002 | Johnson et al. ............ | 365/222 |
| 6,418,067 B1 | | 7/2002 | Watanabe et al. ........... | 365/200 |
| 6,580,651 B2 | | 6/2003 | Han ........................... | 365/191 |
| 6,597,622 B2 | | 7/2003 | Lee et al. ............. | 365/230.03 |
| 6,603,694 B1 | | 8/2003 | Frankowsky et al. ....... | 365/222 |
| 6,603,704 B2 | | 8/2003 | Wilson ....................... | 365/222 |
| 6,680,875 B2 | * | 1/2004 | Horiguchi et al. .......... | 365/233 |
| 6,704,234 B2 | * | 3/2004 | Mizugaki .................... | 365/222 |

* cited by examiner

*Primary Examiner*—Son Mai
(74) *Attorney, Agent, or Firm*—Dicke, Billig & Czaja, PLLC

(57) ABSTRACT

The present invention is a random access memory device with reduced refresh current and method for use in the same. The memory device includes a memory array with a plurality of memory cells. The memory cells are configured to hold a charge. A command block is coupled to the memory bank and is configured to receive refresh commands that are used to periodically refresh the memory cells. A detection circuit is coupled to the command block and to the memory array. The detection circuit is configured to store a hit detect signal when the memory array is accessed. The detection circuit also receives the refresh command. The detections circuit enables block select signals only when the hit detect signal is stored while the refresh command is received.

20 Claims, 6 Drawing Sheets

MEMORY SYSTEM WITH REDUCED REFRESH CURRENT

BACKGROUND

The invention relates to a control circuit for use with refresh operation in a memory device. The circuit inhibits unused array blocks from refresh operation.

In dynamic random access memory (DRAM) systems, it is necessary for the information stored in the memory cells to be refreshed at cyclical intervals. In DRAM memory cells the information is stored as capacitor charges and the capacitors loose charges due to leakage currents. Consequently, the storage charges of the capacitors have to be repeatedly renewed, or the stored charge, and thus stored data, will be lost.

For all types of DRAM refresh operation is necessary to retain stored data. For synchronous dynamic random access memory (SDRAM) or double data rate synchronous dynamic random access memory (DDR SDRAM) an auto refresh or self-refresh signal is used. For example, for a 256M SDRAM or DDR SDRAM a distributed refresh command (auto refresh) is provided every 7.81 microseconds. Alternatively, 8,192 refresh commands are provided in a burst every 64 milliseconds (self refresh) in order to maintain the stored data.

The DRAM consists of a multitude of memory cells accessible by column and row. The memory cells are typically further divided into memory banks, each containing memory cell array blocks. The refreshing of memory contents of the memory cells in the DRAM is generally carried out row-by-row with an internal refresh drive circuit. For low power or mobile DRAM applications where small current consumption is emphasized to enlarge battery life, various techniques are utilized in an attempt to minimize these refresh operations, because they consume significant current. One such technique is partial array self refresh (PASR). In order to save current, this feature allows a user to select the amount of memory that will be refreshed during a self-refresh cycle. In a 256M low powered DRAM, PASR comprises each of the memory banks, two banks, one bank, a half bank, and one quarter bank. Reducing the number of banks to be refreshed saves the amount of refresh current used. Similarly, decreasing the number of refresh cycles also saves refresh current. Another technique used to save current is the deep power down mode. In order to achieve maximum current reduction, all internal voltage generators are stopped with this mode. Data will not be retained once the device enters the deep power down mode.

Although these methods save current consumption and can enlarge battery life, refreshing each row of the DRAM still consumes significant amounts of current. An improvement to refresh operation of the DRAM in order to save current would be a useful improvement to the art.

SUMMARY

The present invention is a random access memory device with reduced refresh current and method for use in the same. The memory device includes a memory array with a plurality of memory cells. The memory cells are configured to hold a charge. A command block is coupled to the memory bank and is configured to receive refresh commands that are used to periodically refresh the memory cells. A detection circuit is coupled to the command block and to the memory array. The detection circuit is configured to store a hit detect signal when the memory array is accessed. The detection circuit also receives the refresh command. The detections circuit enables block select signals only when the hit detect signal is stored while the refresh command is received.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefor, is not to be taken in a limiting sense, and the scope of the present invention is defined by the appended claims.

Figure 1:
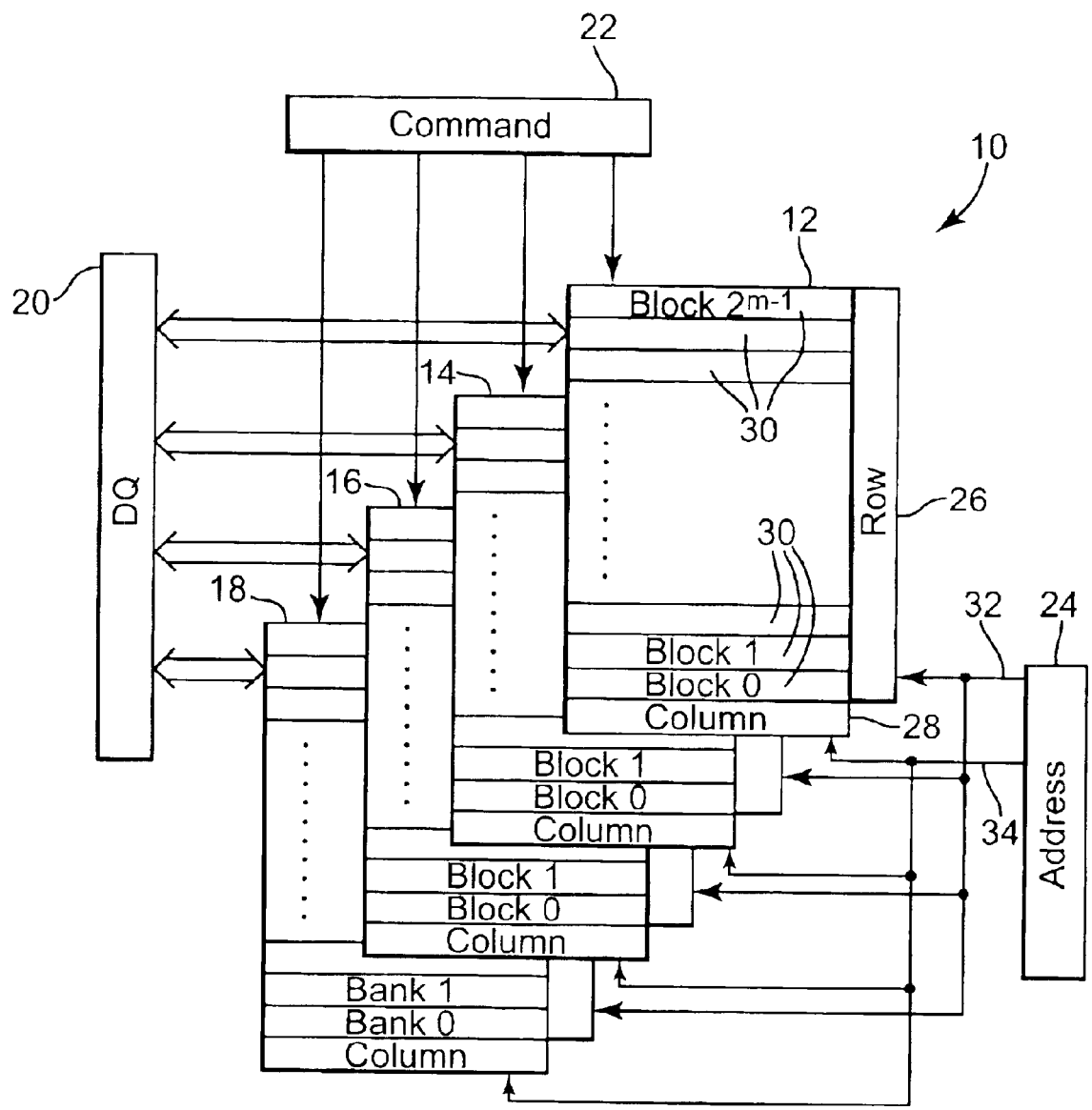
FIG. 1 illustrates one embodiment of a DRAM structure.

FIG. 1 illustrates a random access memory, which in one embodiment is a dynamic random access memory (DRAM) 10. DRAM 10 is configured in accordance with the present invention to have reduced refresh current. DRAM 10 includes memory banks 12, 14, 16, and 18. DRAM 10 further includes data bus 20, command block 22 and address block 24. Each memory bank 12, 14, 16, and 18 include a row decoder block 26 and a column decoder block 28. Further, each memory bank 12, 14, 16, and 18 include a multitude of memory array blocks 30.

Data bus 20 is coupled to each memory bank 12, 14, 16, and 18, and controls the data path for both the read and write operations. Command block 22 receives external commands and is coupled to each memory bank 12, 14, 16, and 18 and decodes external commands and generates internal control signals to the memory banks. Address block 24 includes row address line 32 and column address line 34. Address block 24 transfers external addresses to row decoder blocks 26 (for each of banks 12, 14, 16, and 18) via row address line 32 for active/precharge operation. Address block 24 transfers external addresses to column decoder blocks 28 (for each of banks 12, 14, 16, and 18) via column address line 34 for read/write operation. Row decoder blocks 26 decode row addresses and select one row within array block 30. Column decoder blocks 28 decode column addresses and select one or multiple columns within block 30 and perform read/write operations.

Memory banks 12, 14, 16, and 18 consist of $2^m$ array blocks 30. For a 256M low power DRAM, m is 5 such that there are 32 array blocks 30 for each memory bank 12, 14, 16, and 18. Each array block 30 consists of a multitude of rows and columns.

Figure 2:
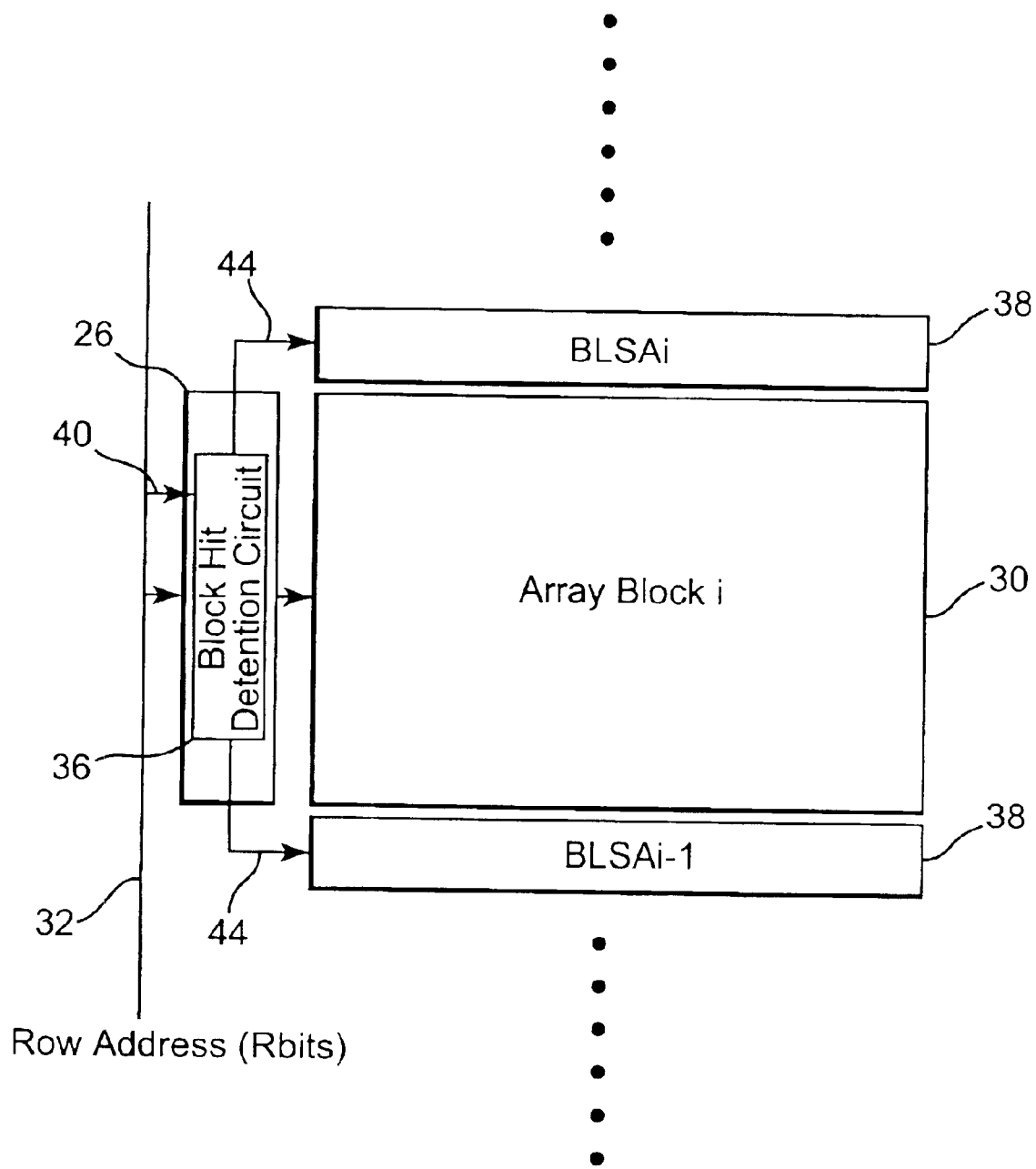
FIG. 2 illustrates one array block in a bank of a DRAM.

FIG. 2 illustrates a single array block 30 from a memory bank. Array block 30 is coupled to row decoder block 26. Row decoder block 26 communicates with address block 24 via row address line 32. Row decoder block 26 includes block hit detection circuit 36. Array block 30 is bound on both sides by bit line sense amplifier (BLSA) blocks 38. BLSA blocks 38 are in communication with block hit detection circuit 36 within row decoder block 26.

In operation, when particular memory cells are to be accessed by memory system 10, a memory addresses for those cells are received by address block 24. The memory addresses are multiple-bit words that include row and column information. Row address information is sent to row decoder block 26 via row address line 32. Addresses with active command select a single array block 30 with the m-most significant bits 40 in the row address by activating two neighboring BLSA blocks 38. The m-most significant bits 40 of the row address are received by block hit detection circuit 36 and decoded such that BLSA blocks 38 are activated to select the array block 30 between the selected BLSA blocks 38. The remaining row address bits are received by row decoder block 26, which then selects one row within the selected array block 30 by decoding the remaining portion of the address.

In operation, DRAM 10 must be refreshed in order to avoid loss of data. Refresh commands are periodically sent to command block 22. When command block 22 interprets an external input as a refresh command for auto refresh or for self refresh, it generates sequential an active and precharge control signals with internal timing restriction. For auto refresh this sequence occurs once. For self refresh, the sequence continues until external self refresh exit command is received. Refresh signals for both sequential active and precharge operation apply to all banks 12, 14, 16, and 18 of DRAM 10 simultaneously.

Figure 3:
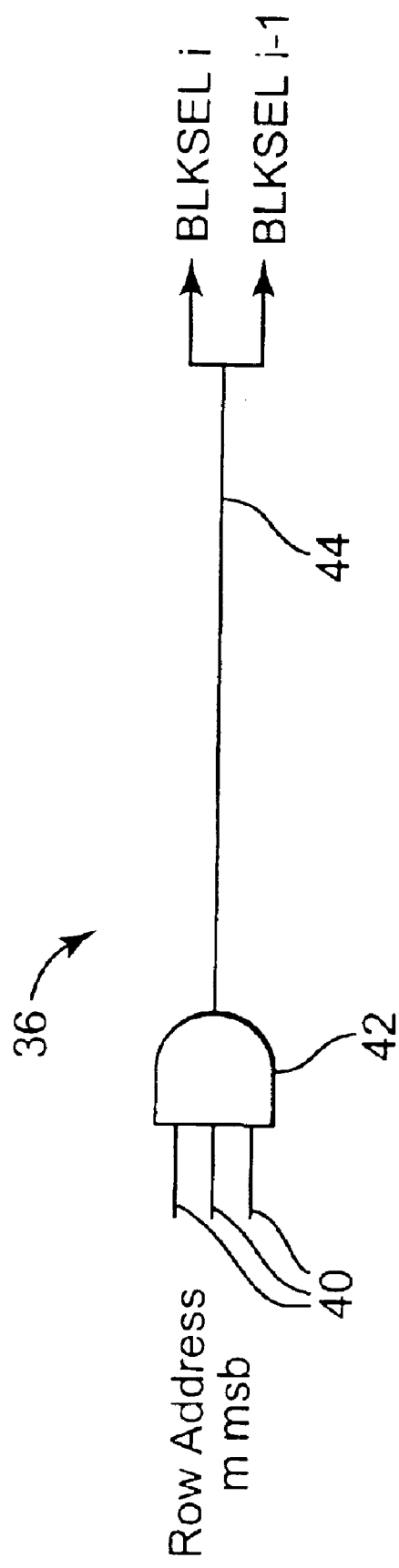
FIG. 3 illustrates a block hit detection circuit.

FIG. 3 illustrates a functional block diagram of block hit detection circuit 36. Block hit detection 36 includes block hit logic 42 and is configured to receive the m-most significant bits 40 from the row address. Block hit detection circuit 36 then processes these bits in order produce BLSA enable signal 44. BLSA enable signal 44 comprises block select signal (BLKSEL) i and block select signal (BLKSEL) i-1. In other words, BLSA enable signal 44 will enable BLSA i with BLKSEL i signal and BLSA i-1 with BLKSEL i-1 signal. BLSA i and BLSA i-1 are on either side of array block i, and thus provide access to array block i. In this way, array block i is selected by block hit detection circuit 36 by its production of BLSA enable signal 44. The remaining row address bits are then processed by row decoder block 26 to select a single row within array block i.

Figure 4:
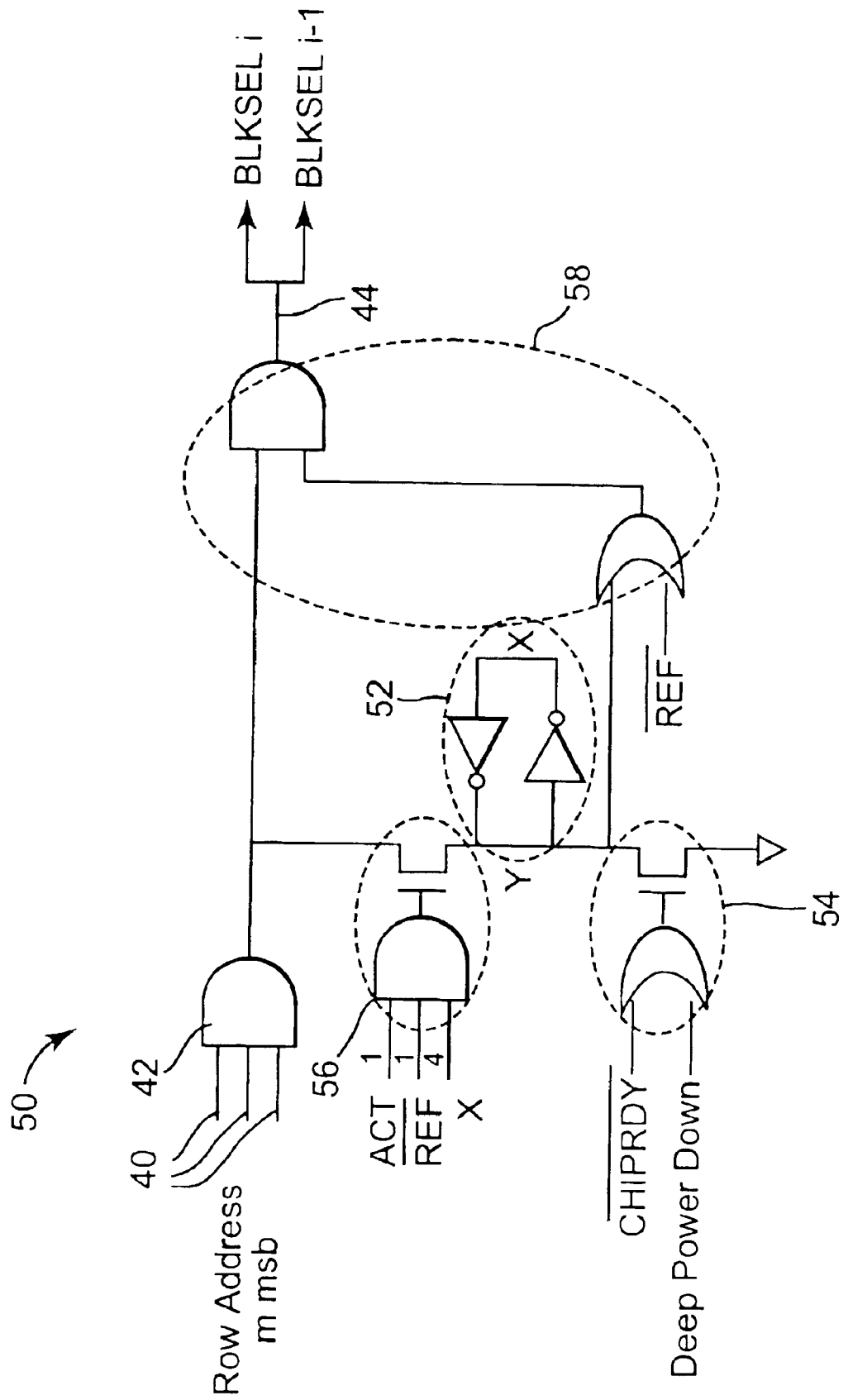
FIG. 4 illustrates a modified block hit detection circuit in accordance with the present inventions.

FIG. 4 is a functional illustration of modified block hit detection circuit 50 in accordance with the present invention. Modified block hit detection circuit 50 includes block hit logic 42, storage circuit 52, reset circuit 54, gate circuit 56, and enable circuit 58.

Modified hit detection circuit 50 and block hit logic 42 receive the m-most significant bits 40 of the row address as with block hit detection circuit 36 in FIG. 3. BLSA enable signal 44 is not enabled or disabled directly from the m-most significant bits 40 of the row address exclusively, however, as was the case in block hit detection circuit 36 of FIG. 3. In modified block hit detection circuit 50, circuits 52, 54, 56, and 58 interact with the m-most significant bits 40 of the row address to selectively enable and disable BLSA enable signal 44 (and thus, BLKSEL i and BLKSEL i-1) in accordance with the present invention.

Specifically, if an array block 30 is used and a refresh operation is applied via command block 22, normal active operation is performed by enabling BLSA enable signal 44 (producing BLKSEL i and BLKSEL i-1) thereby refreshing array block 30(i). If an array block 30 has not been used, however, and a refresh operation is applied via command block 22, modified block hit detection circuit 50 prohibits generation of BLSA enable signal 44 (thereby not producing BLKSEL i and BLKSEL i-1). Thus, array block 30(i) will not be refreshed, and this will save current in DRAM 10.

Storage circuit 52 is essentially a latch that stores array block hit information. Whenever an array block 30 is accessed, the fact that this access has occurred, that is, this "array block hit information" is stored. Storage circuit 52 includes a node Y and a node X on either side of some logic circuitry. Each time the m-most significant bits 40 of the row address is provided in order to access an array block 30, this array block hit information, or "hit detect signal," is stored at node Y in storage circuit 52. The inverse of the hit detect signal is stored at node X.

Reset circuit 54 is an initialization or reset circuit. Reset circuit 54 is configured to receive a chip ready ($\overline{\text{CHIPRDY}}$) signal, which indicates power-up of the system when this signal is "low", and a deep power down signal, indicating that the system is entering the deep power down mode when this signal is "high". During power-up sequences or deep down power mode reset, circuit 54 resets node Y in storage circuit 52.

Gate circuit 56 is configured to receive three signals: (1) the active command signal (ACT), which signals the activation of a selected memory block when this signal is "high"; (2) a refresh signal ($\overline{\text{REF}}$), which indicates either self refresh or auto refresh command signal when this signal is "low"; and (3) the inverse of the hit detection signal stored at node X. Gate circuit 56 receives these signals and allows array block hit information, or the hit detect signal, to be stored at node Y of storage circuit 52 under appropriate conditions. Enable circuit 58 is then configured to receive the hit detect signal stored at node Y of storage circuit 52 and the refresh signal ($\overline{\text{REF}}$). Enable circuit 58 then alternatively enables and disables BLSA enable signal 44.

In operation, modified block hit detection circuit 50 operates to enable refresh operation for used array blocks 30 and to inhibit refresh operation for unused array blocks 30, thereby both preserving the stored information and at the same time saving current consumption in DRAM 10. The m-most significant bits 40 of the row address are received by block hit logic 42, the output of which is connected to gate circuit 56 and enable circuit 58. When the ACT signal is high (indicating the activation of a selected array), the $\overline{\text{REF}}$ signal is high (indicating that neither the self refresh or auto refresh is active), and the inverse of the hit detect signal (stored at node X) is high, gate circuit 56 gates though and allows the output of block hit logic 42 to be stored at node Y of storage circuit 52. Thus, once an array block 30 is used, that block hit information is stored in storage circuit 52 at node Y. Node Y of storage circuit 52 coupled to enable circuit 58, as is the $\overline{\text{REF}}$ signal. Consequently, BLSA block enable signal 44 will only be enabled when a block hit signal is stored in storage circuit 52 and either self refresh or auto refresh occurs.

If an array block 30 is not accessed or used, the hit detect signal stored at node Y of storage circuit 52 will be low, and thus, during a refresh operation enable circuit 58 will receive low signals from both storage circuit 52 and from the $\overline{\text{REF}}$ signal, thereby not enabling BLSA enable signal 44. In this way, if an array block 30 is not accessed or used, it will not be refreshed during the refresh operation thereby saving the current that would have otherwise have been used during refresh operation of that array block 30.

Reset circuit 54 is configured to reset node Y of storage circuit 52 each time after power up via $\overline{\text{CHIPRDY}}$ signal and with each deep power down signal. Thus, the hit detect signal is reset each time there is a power up or a deep down power down mode is entered.

Figures 5A, 5B, 5C:
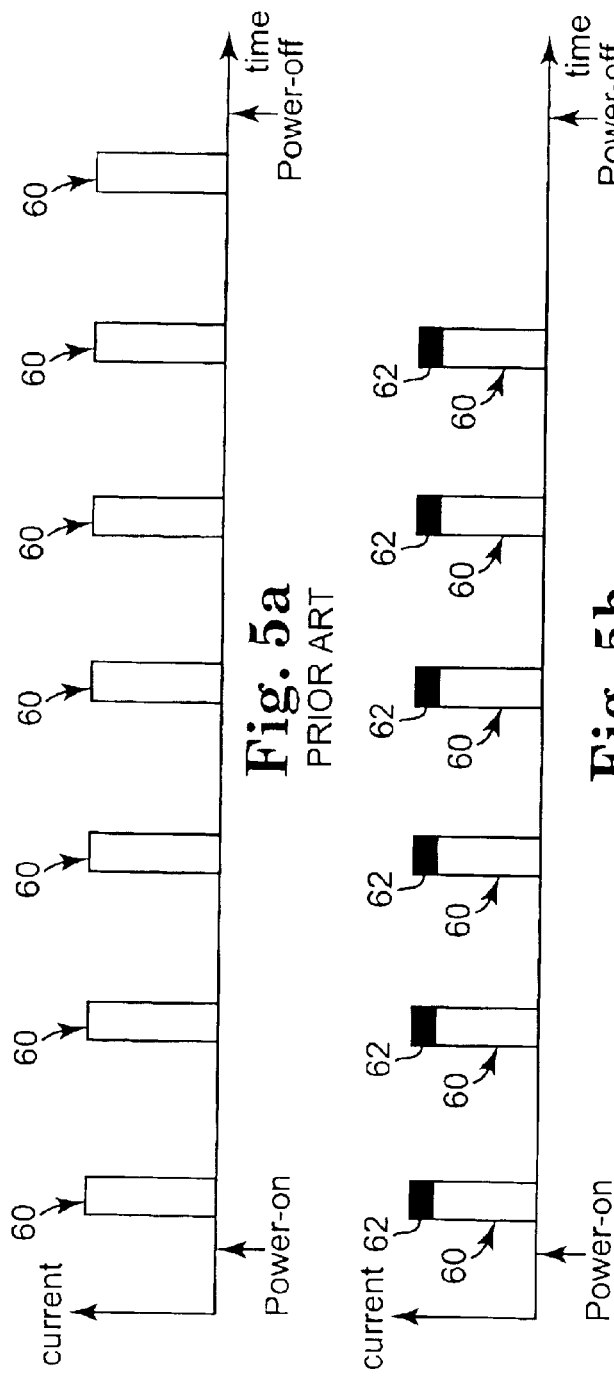
FIG. 5a–5c illustrates refresh current savings using prior art PASR and deep power down mode.

FIG. 5a–FIG. 5c illustrates the current that is saved using the conventional partial array self refresh and deep power down mode. FIG. 5a illustrates typical current consumption for conventional DRAM during refresh cycles. The total power consumed during a refresh operation is illustrated by consumed current blocks 60. The left side of each consumed current block 60 illustrates the entry into the refresh cycle, the right side of each block 60 illustrates the exit from the refresh cycle, and the height of each block 60 illustrates the amount of current used during the cycle.

FIG. 5b illustrates the current saved by reducing the number of banks to be refreshed with a partial array self refresh. The height of each consumed current block 60 illustrates the amount of current consumed without the partial array self refresh and the height reduced by PASR saved current block 62 illustrates the current savings gained by using the partial array self refresh mode. PASR saved current block 62 is shown in FIG. 5b as the solid black portion and represents the amount of current saved by the system from using the partial array self refresh.

FIG. 5c illustrates the current saved with deep power down mode. After the system is powered on, current consumption is illustrated by consumed current blocks 60. Again, the left side of each block 60 represents entry of the refresh cycle, the right side of each block 60 represents the exit of the refresh cycle, and the top of each block 60 represents the amount of current consumed during the refresh cycle. The system enters deep power down mode at the time illustrated by arrow 64. No current is expended during the deep power down mode. Consequently, power down current saved block 63 entirely replaces consumed current blocks 60 during deep power down mode. Power down current saved block 63 is shown in FIG. 5c as the solid black portion and represents the amount of current saved by the system from entering the deep down power mode. The system exits deep power down mode at the time illustrated by arrow 66 and the current used after exiting deep power down mode is illustrated by the consumed current blocks 60.

Figure 6A:
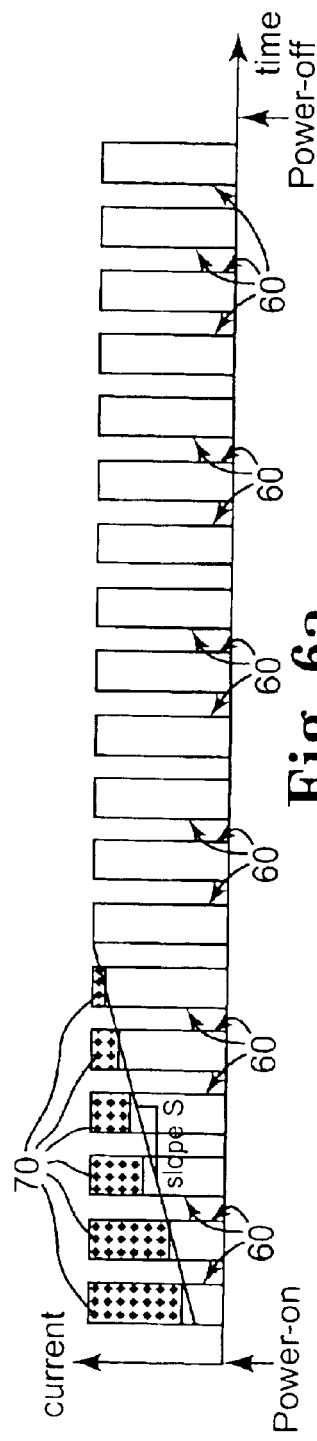
FIG. 6a–6c illustrates refresh current savings in accordance with the present invention.
Figure 6B:
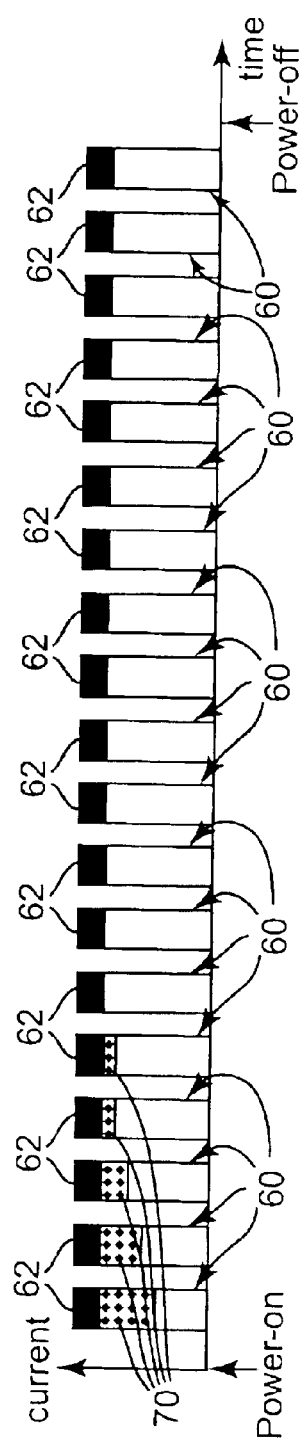
Figure 6C:
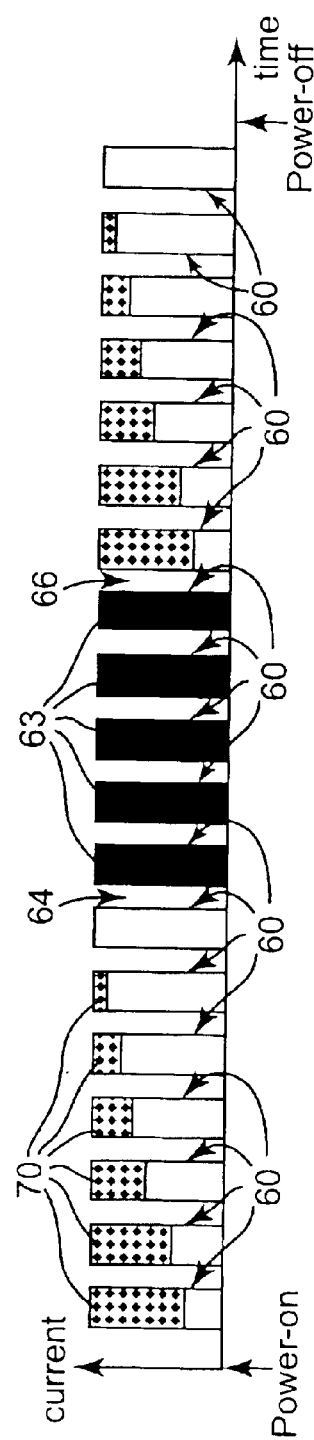

FIG. 6a–FIG. 6c illustrates current savings using the present invention. FIG. 6a illustrates the current saved while utilizing the present invention in conjunction with conventional DRAM. The total power consumed during a refresh operation is illustrated by consumed current blocks 60. The left side of each consumed current block 60 illustrates the entry into the refresh cycle, the right side of each block 60 illustrates the exit from the refresh cycle, and the height of each block 60 illustrates the amount of current used during the cycle. FIG. 6a also shows the amount of current saved by the system by not refreshing those memory array blocks that are unused, illustrated by the shaded portion in the figure and identified hereinafter as unused array current savings block 70.

Also illustrated in FIG. 6a is a slope s that follows the unused array current savings block 70 as the system temporally moves past the power on stage. As the memory continues to fill up, the current savings due to not refreshing the unused array blocks continues to decrease. The slope S is dependant on the application program running in the system and on the number of banks in the system, as well as on the number of array blocks within a bank. If n is the number of banks and $2^m$ is the number of array blocks within a bank, then as either n or m increase, the slope S is going to be more gentle and lead to more current savings. Typically, DRAMs have 4 (n=4) or more banks and have a large number of array blocks within each bank. The more array blocks within a bank, the more current reduction will take place in accordance with the present invention.

FIG. 6b illustrates the current saved while utilizing the present invention in conjunction with reducing the number of banks to be refreshed with a PASR. The height of consumed current block 60 illustrates the total current consumed without the use of PASR or of the unused array block of the present invention. The height of consumed current block 60 reduced by saved current block 62 and by unused array current savings block 70 illustrates the current savings gained by using the PASR in conjunction with the present invention.

FIG. 6c illustrates the current saved while utilizing the present invention in conjunction with deep power down mode. After the system is powered on, current consumption is illustrated by consumed current blocks 60. The amount of current saved by the system from not refreshing those memory array blocks that are unused is illustrated by the shaded portion identified as unused array current savings block 70. The system enters deep power down mode at the time illustrated by arrow 64. No current is expended during the deep power down mode. Consequently, power down current saved block 63 entirely replaces consumed current blocks 60 during deep power down mode. Power down current saved block 63 is shown in FIG. 6c as the solid black portion and represents the amount of current saved by the system from entering the deep down power mode. The system exits deep power down mode at the time illustrated by arrow 66 and the current used after exiting deep power down mode is illustrated by the consumed current blocks 60. Again, the amount of current saved by the system from not refreshing those memory array blocks that are unused is illustrated by the shaded portion identified as unused array current savings block 70. Since deep down power mode resets all saved array block hit signals (stored at node Y in storage circuit 52 of FIG. 4), additional current savings occurs after exit from deep power down mode.

Use of the present invention decreases current consumption in a dynamic memory device. A semiconductor memory device is provided with at least one memory bank having multiple memory array blocks. Each memory array has a plurality of memory cells. Write operations are performed on the memory device such that data is written to the cells within the memory array blocks. Memory array block access is then tracked and then stored. Periodically, the memory is refreshed in order to retain data. The stored record of array block access is then used to prevent refreshing of array blocks that have not been accessed and allowing refreshing of array blocks that have been accessed.

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, the functional circuit 52, 54, 56, and 58 of FIG. 4 are illustrated with logic circuits that one skilled in the art will recognize can be implemented in many various configurations while still achieving the objects of the present invention. This application is intended to cover any adaptations or variations of the specific embodiments discussed herein. Therefore, it is intended that this invention be limited only by the claims and the equivalents thereof.

What is claimed is:

1. A random access memory device comprising:
   a memory array having a plurality of memory cells configured to hold a charge;
   a command block coupled to the memory array and configured to receive a refresh commands used to refresh the memory cells; and
   a detection circuit coupled to the command block and to the memory array, the detection circuit configured to store a hit detect signal when the memory array is accessed, and receive the refresh command including enabling block select signals only when the hit detect signal is stored while the refresh command is received.

2. The random access memory device of claim 1 wherein the memory array is contained in a memory bank, the random access memory device having multiple memory banks and multiple memory arrays within each memory bank.

3. The random access memory device of claim 1 wherein the detection circuit is configured with a latch to store the hit detect signal when a memory array is accessed.

4. The random access memory device of claim 3 further including an enable circuit coupled to the latch and configured to receive the refresh command such that the enable circuit enables block select signals when the hit detect signal is stored while a refresh command is received and disables block select signals when the hit detect signal is not stored while a refresh command is received.

5. The random access memory device of claim 1 further comprising an address block configured to receive address information.

6. The random access memory device of claim 5 further comprising a row decoder block coupled to the address block to receive row address information, wherein the detection circuit is within the row decoder block.

7. The random access memory device of claim 6 wherein the address information received by the address block comprises a number of bits, some of which identify a memory array within a memory bank, these bits also received by the detection circuit such that the detection circuit can store information indicative of which memory arrays have been accessed.

8. The random access memory device of claim 1 wherein the detection circuit is configured to receive an active command signal indicative of whether a memory array has been activated and a refresh signal indicative of whether a refresh command has been given.

9. The random access memory device of claim 3 wherein the detection circuit further includes a reset circuit configured to reset the stored hit detect signal each time the memory device powers up and each time the memory device enters a deep power down mode.

10. A semiconductor memory device comprising:
    at least one memory bank having multiple memory array blocks, the memory array blocks each having multiple memory cells with a unique column and row address, each cell configured to hold a charge;
    an address block coupled to the memory bank and configured to receive address information;
    a row decoder block coupled to the address block to receive row address information;
    a command block coupled to the memory bank and configured to receive a refresh commands to refresh the charge in the memory cells; and
    a block hit detection circuit within the row decoder block, the block hit detection circuit including a latch to store a hit detect signal when an array block is accessed, and including an enable circuit coupled to the latch and configured to receive the refresh command such that the enable circuit enables block select signals when the hit detect signal is stored while a refresh command is received and does not enable block select signals when the hit detect signal is not stored while a refresh command is received.

11. The semiconductor memory device of claim 10 wherein the memory address comprises a plurality of bits and wherein the block hit detection circuit is responsive to the less than all of the bits of the memory address.

12. The semiconductor memory device of claim 11 wherein the bits of the memory address that the hit detection circuit is responsive to identify one particular array block within one particular memory bank.

13. The semiconductor memory device of claim 10 wherein the block hit detection circuit further includes a gate circuit configured to receive an active command signal indicative of whether an array block has been activated, a refresh signal indicative of whether a refresh command has been given, and an inverse to the hit detect signal indicative of whether the hit detect signal has been stored.

14. The semiconductor memory device of claim 13 wherein the gate circuit allows storage of the hit detect signal when a selected array block has been activated, when no refresh command is present, and when no hit detect signal has already been stored.

15. The semiconductor memory device of claim 13 wherein the gate circuit does not allow storage of the hit detect signal when no selected array block has been activated, or when a refresh command is present, or when the hit detect signal has already been stored.

16. The semiconductor memory device of claim 10 wherein the block hit detection circuit further includes a reset circuit configured to reset the stored hit detect signal each time the memory powers up and each time the memory enters a deep power down mode.

17. A method of decreasing current consumption in a dynamic memory device, the method including the steps of:
    providing a semiconductor memory device with at least one memory bank having multiple memory array blocks, each memory array having a plurality of memory cells;
    performing write operations on the memory device such that data is written to the cells within the memory array blocks;
    storing a record of whether a memory array block is accessed;
    refreshing the memory in order to retain data; and preventing refreshing of array blocks that have not been accessed and allowing refreshing of array blocks that have been accessed.

18. The method of claim 17 further including the step of resetting the stored record of array block access after the dynamic memory device is powered up.

19. The method of claim 17 further including the step of resetting the stored record of array block access after the dynamic memory device enters a deep power down mode.

20. A semiconductor memory device comprising:

a memory array having a plurality of memory cells configured to hold a charge;

means coupled to the memory array for receiving a refresh commands used to refresh the memory cells; and means coupled to the command block and to the memory array for storing a hit detect signal when the memory array is accessed, for receiving the refresh command, and for enabling block select signals only when the hit detect signal is stored while the refresh command is received.

\* \* \* \* \*

UNITED STATES PATENT AND TRADEMARK OFFICE
CERTIFICATE OF CORRECTION

PATENT NO. : 6,862,238 B1  Page 1 of 1
APPLICATION NO. : 10/672244
DATED : March 1, 2005
INVENTOR(S) : Joo-Sang Lee It is certified that error appears in the above-identified patent and that said Letters Patent is hereby corrected as shown below:

Column 2, line 45, delete "therefor" and insert in place thereof --therefore--.

Column 3, line 41, delete "an".

Column 8, line 11, delete "commands" and insert in place thereof --command--.

Column 10, line 2, delete "commands" and insert in place thereof --command--.

Signed and Sealed this

Twenty-fifth Day of December, 2007

JON W. DUDAS
*Director of the United States Patent and Trademark Office*